United States Patent
Nakajima et al.

(10) Patent No.: US 8,019,448 B2
(45) Date of Patent: Sep. 13, 2011

(54) STAGE DEVICE

(75) Inventors: Ryuta Nakajima, Yokosuka (JP);
Hidehiko Mashimo, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 457 days.

(21) Appl. No.: 12/232,266

(22) Filed: Sep. 12, 2008

(65) Prior Publication Data

US 2009/0245980 A1  Oct. 1, 2009

(30) Foreign Application Priority Data

Sep. 14, 2007  (JP) ................. P2007-239901

(51) Int. Cl.
*G06F 19/00* (2006.01)

(52) U.S. Cl. .............. 700/60; 700/243; 414/222.02

(58) Field of Classification Search .......... 700/60, 700/228, 230, 243; 414/222.02; 29/740, 29/721; 250/491.1; 451/57, 313; 156/64
See application file for complete search history.

(56) References Cited

U.S. PATENT DOCUMENTS

| | | | |
|---|---|---|---|
| 4,928,936 A * | 5/1990 | Ohkubo et al. .......... | 269/73 |
| 5,168,166 A * | 12/1992 | Hayakawa et al. ...... | 250/492.2 |
| 6,504,162 B1 * | 1/2003 | Binnard et al. ......... | 250/492.2 |
| 6,593,997 B1 * | 7/2003 | Watson et al. .......... | 355/53 |
| 6,788,385 B2 * | 9/2004 | Tanaka et al. .......... | 355/53 |
| 6,894,449 B2 * | 5/2005 | Nishi .................... | 318/114 |
| 7,049,585 B2 * | 5/2006 | Nakasuji et al. ........ | 250/310 |
| 7,241,993 B2 * | 7/2007 | Nakasuji et al. ........ | 250/310 |
| 2002/0196421 A1 * | 12/2002 | Tanaka et al. .......... | 355/72 |
| 2003/0136309 A1 * | 7/2003 | Shinozaki et al. ...... | 108/20 |
| 2006/0094343 A1 * | 5/2006 | Sato et al. ............. | 451/313 |

FOREIGN PATENT DOCUMENTS

| | | |
|---|---|---|
| JP | 06-148361 | 5/1994 |
| JP | 09-293773 A | 11/1997 |
| JP | 11-218941 | 8/1999 |
| JP | 2005-025695 A | 1/2005 |
| JP | 2005-301936 | 10/2005 |
| JP | 2007-027659 | 2/2007 |

OTHER PUBLICATIONS

Iop Science, A method for determining the alignment accuracy of the treatment table axis at an iscoentic irradation facility, 2001, IOP Science, p. N19-N26.*
Japanese Office Action application No. P2007-239901 dated Sep. 14, 2010.

* cited by examiner

*Primary Examiner* — Kidest Bahta
(74) *Attorney, Agent, or Firm* — Squire, Sanders & Dempsey (US) LLP

(57) ABSTRACT

The vibrations of a second table supported on a first table that is movable in one horizontal direction can be controlled. A stage device includes an XY axis table movable in the X-direction, a Z-axis table supported by a support portion on the XY axis table, a pair of scales that are arranged apart from each other in the X-direction and detect the Z-direction velocity on the Z-axis table, a pair of motors that are arranged apart from each other in the X-direction and drive the Z-axis table in a vertical direction on the Z-axis-table, and a controller controls the drives of the motors based on the Z-direction velocity detected, in which the behavior of pitching vibrations in the Z-axis table is determined by detecting the Z-direction velocity with the scales, and the motors are driven and then the Z-axis table is rotated in a pitching direction so that the pitching vibrations are cancelled.

5 Claims, 4 Drawing Sheets

(a)

(b)

(a)

(b)

(c)

STAGE DEVICE

BACKGROUND OF THE INVENTION

1. Field of the Invention

The present invention relates to a stage device, and, in particular, to a stage device used in the fields of semiconductors and liquid crystals.

2. Related Background of the Invention

It has been known that a stage device in the prior art includes a first table (XY table) movable in one horizontal direction and a second table (wafer holding member) supported by a support unit (Z-axis member) on the first table (e.g., Refer to Japanese Unexamined Patent Application Publication No. 2007-27659).

SUMMARY OF THE INVENTION

However, in the stage device described above, when the first table is moved in one horizontal direction, there is a fear that the second table may be vibrated in the direction of rotation around an axis crossing the horizontal direction and the vertical direction (hereinafter, called "pitching direction") due to the influence of an acceleration force.

Then, it is an object of the present invention to provide a stage device capable of controlling the vibration of the second table supported on the first table that is movable in one horizontal direction.

To solve the problem above, the stage device according to the present invention, having the first table movable in the one horizontal direction and the second table supported by a support portion on the first table, comprises a pair of detectors that are arranged apart from each other in the one horizontal direction and detect a position or a velocity of the second table in the vertical direction; a pair of motors that are arranged apart from each other in the one horizontal direction and drive the second table in the vertical direction; and a controller that drives the pair of motors based on the position or the velocity in the vertical direction of the second table that is detected by the pair of detectors.

In this stage, the pair of detectors and the pair of motors are arranged apart from each other in the one horizontal direction. Thus, for example, when the first table is moved in the one horizontal direction and then the second table vibrates in the pitching direction (hereinafter, called "pitching vibration"), the position or the velocity in the vertical position of the second table is detected at each position along the one horizontal direction by the pair of detectors respectively. As a result, the inclination angle and the angular velocity in the pitching direction of the second table can be determined and the behavior of the pitching vibration of the second table can also be grasped. Then, driving the pair of motors allows the second table to rotate in the pitching direction so that the pitching vibrations are cancelled to control thereby the pitching vibrations being suppressed. Accordingly, the vibrations of the second table supported on the first table that is movable in the one horizontal direction can be controlled.

Here, the pair of detectors and the pair of motors may be placed in symmetric positions respectively relative to the one horizontal direction around a support point by the support portion in the second table. In addition, the controller may, specifically drive the pair of motors and then control the angular velocity of the second table around the axes that cross the one horizontal direction and the vertical direction.

The second table is configured so as to be movable in the vertical direction, and the controller preferably controls the position of the second table in the vertical direction. In this case, the second table can be moved in the vertical direction while being moved in the one horizontal direction.

DESCRIPTION OF THE PREFERRED EMBODIMENTS

Preferred embodiments of the present invention are described in detail with reference to the accompanying drawings. In the description of the drawings, portions that are the same or equivalent are denoted by the same numerals, and will not be described further.

Figure 1:
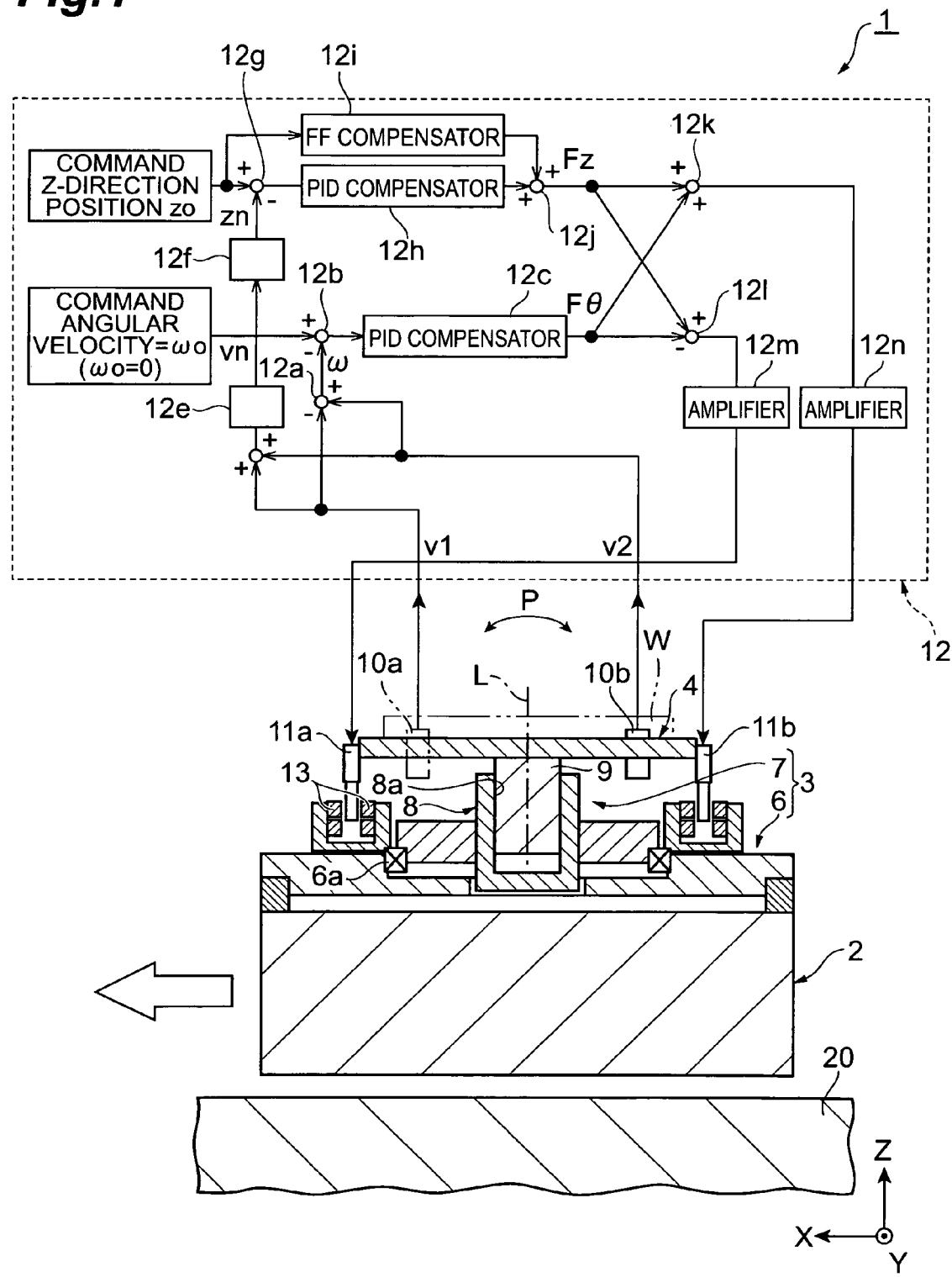
FIG. 1 is a schematic view illustrating a stage device according to one embodiment of the present invention.

FIG. 1 is a schematic view illustrating a stage device according to one embodiment of the present invention. The stage device of the present invention is used as, for example, inspection systems and manufacturing systems for semiconductor devices, magnetic devices, and optical storage devices. As illustrated in FIG. 1, the stage device 1 comprises an XY-axis table (first table), and a Z-axis table (second table) supported by a support portion 3 on the XY-axis table.

Figure 2:
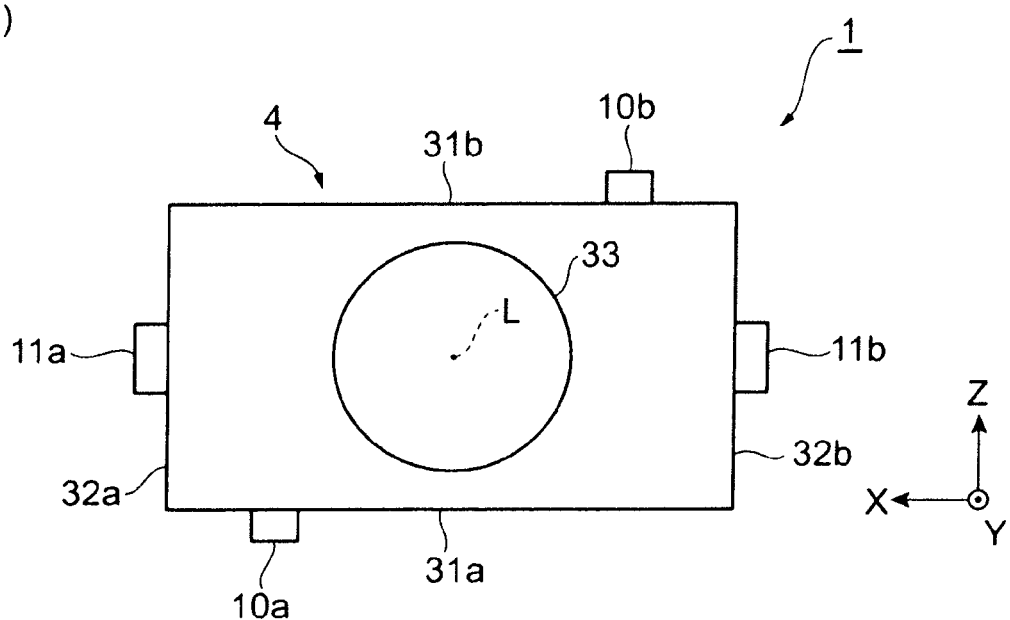
FIG. 2 is a schematic view of the stage device in FIG. 1 viewed from above.
Figure 2:
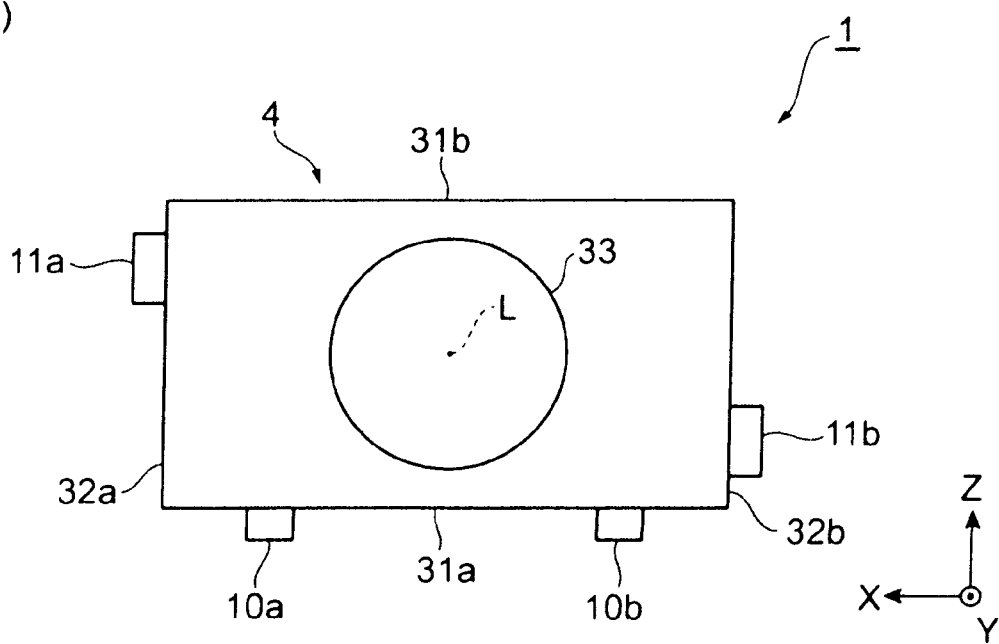

The XY-table 2 is supported for example, by an air bearing (not shown) on a surface plate 20 in non-contact and is movable on the surface plate 20 in the X-direction (one horizontal direction, a right-and-left direction to a page space) and in the Y-direction (the vertical direction to a page space). The Z-axis table 4 is mounted on a top surface thereof by adsorbing an object W by an adsorption portion 33 (refer to FIG. 2) having a vacuum chuck and the like.

A support portion 3 comprises a rotation support portion 6 and a Z-axis support portion 7. The rotation support portion 6 is placed on the XY-axis table 2 and supports the Z-axis support portion 7 via the bearing 6a. Thus, the Z-axis support portion 7 is relatively movable around the Z-axis relative to the rotation support portion 6. The Z-axis support portion 7 comprises a guide portion 8 having a guide hole 8a opening above, and a Z-axis member 9 being long scale-shaped in the Z axis (vertical direction, up and down direction to a page space) in which the Z-axis member 9 is slidably fitted into the guide hole 8a by air in the vertical direction. Then, this Z-axis member 9 is connected to the central portion of the bottom surface of the Z-axis table 4. This allows the Z-axis table 4 to move in the Z-direction.

Here, the stage device 1 comprises a pair of scales (detectors) 10a, 10b, a pair of motors 11a, 11b, and a controller 12.

The scales 10a, 10b detect the Z-direction velocity of the Z-axis table 4. Here, for example, linear encoders using interference of laser light are employed as the scale 10a, 10b. These scales 10a, 10b are provided at positions symmetrically around a support point (herein, the axis L of the Z-axis member 9) by the support portion 3 in the Z-axis table 4, respectively. In other words, the scales 10a, 10b are arranged apart from each other (namely in offset) in the X-direction (namely, the scales 10a, 10b are arranged in parallel in the X-direction, as viewed from the Y-direction). This "symmetry" includes not only complete symmetry but also substantial symmetry, for example, symmetry with variations due to dimensional tolerances and errors in manufacturing (hereinafter, the same).

Specifically, as illustrated in FIG. 2(a), the scale 10a is provided on one end side in the X-direction in one side surface 31a that crosses the Y-direction of the Z-axis direction member 9, and the scale 10b is provided on the other end side in the X-direction in the other side surface 31b. These scales 10a, 10b are placed to face each other via the Z-axis member 9, and each distance in the X-direction between each scale and a portion (a central portion) to which the Z-axis member 9 of the Z-axis table 4 is connected is equal. The scales 10a, 10b detect a velocity in the Z-direction at each position, in both of the X-direction sides in the Z-axis table 4. A controller 12 is connected to the scales 10a, 10b respectively, as illustrated in FIG. 1.

The motors 11a, 11b drive the Z-axis table 4 in the Z-direction. Here, coil motors are used as the motors 11a, 11b. These motors 11a, 11b are placed at positions symmetrically around a support point by the support portion 3 in the Z-axis table 4 respectively. In other words, the motors 11a, 11b are arranged apart from each other in the X-direction (namely, the motors 11a, 11b are arranged in parallel in the X-direction, as viewed from the Y-direction).

Specifically, as illustrated in FIG. 2(a), the motor 11a is placed at the center in the Y-direction of one side surface 32a that crosses the X-direction of the Z-axis member 9, and the motor 11b is placed at the center of the Y-direction of the other side surface 32b. Also, these motors 11a, 11b are placed to face each other via the Z-axis member 9 respectively, and each distance between each motor and a portion to which the Z-axis member 9 of the Z-axis table is connected is equal. Then, the motors 11a, 11b are inserted from above in the intermediate portion between magnets 13 placed on a rotation support portion 6 respectively, and thus, they drive the Z-axis table 4 in the Z-direction at both of the X-direction end sides of the Z-axis table 4. A controller 12 is connected to the motors 11a, 11b respectively, as illustrated in FIG. 1.

The controller 12 comprises, for example, CPU, ROM, and RAM, and controls driving currents applied to the motors 11a, 11b to control the drive of the motors 11a, 11b, based on the Z-direction velocity of the Z-axis table 4 that is detected by the scales 10a, 10b (the specific process operations are described later).

In the stage device 1 described above, when an object W is inspected by an optical system (not shown), such as a camera mounted on the Z-direction upper portion of the Z-axis table 4, the XY-axis table 2 is translationally moved (scan operated) in the X-direction while observing the object W. In conjunction with this movement, the Z-axis table 4 is translationally moved (focus operated) in the Z-direction so that the focus of the optical system becomes focused on the object W. Then, the XY-axis table 2 is translationally moved by a predetermined distance in the Y-direction and the point of observation of the object W is translationally moved in the Y-direction. Thereafter, the focus operation is carried out while observing the object W and the scan operation is being performed. Then, the XY-axis table 2 is translationally moved by a predetermined distance in the Y-direction. Repeating these operations completes the inspection of the object W.

Here, when the focus operation is carried out while performing the scan operation, the Z-direction velocities v1, v2 at each position that is symmetrical with each other in the X-direction around the support point in the Z-axis table 4 are detected by the pair of scales 10a, 10b and then, they are input to the controller 12. Then, the motors 11a, 11b are driven to cooperate with each other by the controller 12 based on the Z-direction velocities v1, v2 and are controlled so that the angular velocity in the pitching direction P of the Z-axis table 4 becomes zero and also the Z-direction position of the Z-axis table 4 is positioned at a predetermined position (for example, a position at which the object W becomes the focus of the optical system). Specifically, the following control functions are carried out by the controller 12.

First, the difference between the Z-direction velocities v1, v2 input is determined by a subtractor 12a, and the angular velocity X in the pitching direction P in the Z-axis table 4 is determined. Subsequently, the difference between a command angular velocity $\omega 0$ (here, $\omega 0=0$) input as the command value of the angular velocity in the pitching direction P and the angular velocity $\omega$ is determined by the subtractor 12b, and then it is input into a PID compensator 12c. The pitching direction thrust command value F$\theta$ is output from the PID compensator 12c.

Also, the sum of the Z-direction velocities v1, v2 is determined by an adder 12d and then this sum determined is divided by two by an arithmetic unit 12e. Thus, the average velocity value vn of the Z-direction velocities v1, v2 is calculated. Then, the average velocity value vn is converted to the Z-direction average position value Zn. The difference between a command Z-direction position z0 input as a Z-direction command value and the Z-direction average position value zn is determined by the subtractor 12g and then is input to a PID compensator 12h. On the other hand, the command Z-direction position z0 is input to an FF compensator 12i. The output value of the PID compensator 12h and the output value of the FF compensator 12i are added by an adder 12j, and thus, a Z-direction thrust command value Fz is calculated.

Subsequently, the sum of the Z-direction thrust command value Fz and the pitching-direction thrust command value F$\theta$ are determined as the thrust command value Fa by an adder 12k and also, the difference between the Z-direction thrust command value Fz and the pitching-direction thrust command value F$\theta$ is determined as a thrust command value Fb by a subtractor 12l. These thrust command values Fa, Fb are output to the motors 11a, 11b as drive current values through each amplifier 12m, 12n. Because of these operations above, the motors 11a, 11b are driven to cooperate with each other. Thus, the Z-axis table 4 is rotated in the pitching direction P so that the angular velocity in the pitching direction P of the Z-axis table 4 becomes zero and the Z-axis table 4 is translationally moved in the Z-direction so that the Z-direction position of the Z-axis table 4 is positioned at a predetermined position.

According to the stage device 1 of the embodiment above, since the scales 10a, 10b and the motors 11a, 11b are arranged apart from each other in the X-direction respectively, the Z-direction velocities v1, v2 at each position along the X-direction in the Z-axis table 4 are detected by the scales 10a, 10b. Thus, the behavior of the pitching vibration in the Z-axis table 4 (herein, the angular velocity in the pitching direction P in the Z-axis table) is determined. Then, the motors 11a, 11b are driven and then the Z-axis table 4 is rotated in the pitching direction P so that the pitching vibrations are cancelled each other out (the angular velocity in the pitching direction P becomes zero). This allows the pitching vibrations in the Z-axis table to be controlled within a short settling time, and in addition, allows the processing capability per unit time of the stage device 1 (it is called "Throughput") to be improved.

That is, the stage device 1 allows the vibrations in the pitching direction P caused by the influence of the movement of the XY-axis table 2 to be controlled, by independently and corporately controlling the motors 11a, 11b. Also, the high-speed movement of the XY-table 2 causes the increase in the acceleration force of the XY-table 2 and the increase in the pitching vibrations. Thus, when the XY-table 2 moves at a high-speed, the effect above, that is, the effect of controlling the pitching vibrations within a short settling time, becomes evident.

In addition, in the embodiment, as described above, the Z-direction velocities of both end sides in the X-direction of the Z-axis table 4 are detected by the scales 10a, 10b. Thus, the resolution of the angular velocity of the Z-axis table 4 that is detected can be improved.

As described above, the motors 11a, 11b drive the Z-axis table 4 in the Z-direction at the both sides in the X-direction of the Z-axis table 4. Thus, the Z-axis table 4 can be rotated in the pitching direction P by a relatively small motor thrust.

In the embodiment, as described above, a Z-axis member 9 is slidably fitted into the guide hole 31 by air. Thus, the pitching vibrations in this fitting easily increase more than that when the member is rigidly supported, and then the effect above that the pitching vibrations are controlled within a short settling time becomes, in particular, effectively.

Moreover, in the embodiment, as described above, the pair of scales 10a, 10b and the pair of motors 11a, 11b are respectively placed at positions symmetrically about the X-direction, around support portions by the support portion 3 in Z-axis table 4. Thus, it is possible to preferably grasp the behavior of the pitching vibrations of the Z-axis table 4 and also, to preferably rotate the Z-axis table 4 in the pitching direction.

In the embodiment, the Z-direction velocities of the Z-axis table 4 are detected by the scales 10a, 10b. However, the Z-direction positions of the Z-axis table 4 may be detected. Also, the angular velocity of the Z-axis table 4 in the pitching direction P is controlled by the controller 12. However, the pitching-direction angle (the position) of the Z-axis table direction may be controlled.

Incidentally, like the embodiment, when the Z-axis table 4 is supported in the central portion by the support portion 3 and the pair of scales 10a, 10b and the pair of motors 11a, 11b are respectively placed at positions symmetrically about the X-direction, around support points by the support portion 3 in the Z-axis table 4, it is possible to preferably detect the velocity and the position of the central position of the Z-axis table 4.

The preferred embodiment of the present invention is described above, but the present invention is not limited to the embodiment above. For example, in the embodiment above, as illustrated in FIG. 2(a), each scale 10a, 10b is provided on each side surface 31a, 31b of the Z-axis member 9. However, as illustrated in FIG. 2(b), each scale 10a, 10b may be placed on one side surface 31a together. In addition, in the embodiment, the motors 11a, 11b are placed at the central portion in the Y-direction on side surfaces 32a, 32b of the Z-axis member 9. However, they may be placed at one side surface end and the other side surface end in the Y-direction. In other words, the pair of scales and the pair of motors may be arranged apart from each other relative to the Z-axis table, in the X-direction.

In the embodiment above, the Z-axis support portion 7 is relatively rotatable around the Z-axis relative to the rotation support portion 6 that is placed on the XY-table 2, and further, the Z-axis table 4 is movably supported in the Z-direction by this Z-axis support portion 7. That is, in the embodiment, the Z-axis table 4 is configured to be movable in the XYZ-direction and rotatable around the Z-axis, so called an XYZθ stage. However, the Z-axis table may be configured to be movable in the X, Y, and Z-directions, so called the XYZ-stage; the Z-axis table may be configured to be movable in the X and Z (Y and Z) directions and rotatable around the Z-axis, so called the XZθ (YZθ) stage; and the Z-axis table is configured to be movable in the X and Z (Y and Z) directions, so called the XZ (YZ) stage. It is important to note that the second table may be supported on the first table which moves in the one horizontal direction.

In the embodiment, the Z-axis table 4 is translationally moved in the Z-direction while the XY axis table 2 is translationally moved in the X-direction. However, the following case may be substituted for this translational movement in the Z-axis direction or the following case may added to this movement; the Z-axis support portion is relatively rotated around the Z-axis and the Z-axis table 4 is rotated around the Z-axis. Moreover, in another case, the following is substituted for the translational movement in the Z-axis direction; the Z-axis table is not translationally moved in the Z-direction. In the embodiment above, also, the Z-axis table 4 is supported at one point in the central portion. However, the Z-axis table 4 may be supported not only at one point in the central portion but also at a plurality of points in other portions.

In the embodiment above, the pair of scales 10a, 10b are provided. However, the scales similar to these scales may be provided further. It is important that the plurality of detectors be provided. For example, when additional scales arranged apart from each other in the vertical direction relative to the scales 10a, 10b, the behaviors not only the pitching vibrations in the pitching direction P that is the direction of rotation around the Y-axis (the Yθ direction) but also the pitching vibrations in the direction of rotation around X-axis (the Xθ direction) can be detected at the same time. That is, it is possible to detect the behavior of the pitching vibrations in the direction of rotation around the straight line that connects the pair of scales 10a, 10b.

In the embodiment above, the pair of motors 11a, 11b are placed. However, the motors similar to these motors may be provided further. It is important that the plurality of motors be provided. For example, when additional motors arranged apart from each other in the vertical direction relative to the motors 11a, 11b, not only the pitching vibrations in the pitching direction P above that is the Yθ direction can be controlled but also the pitching vibrations in the Xθ direction can be controlled, at the same time. That is, it is also possible to control the pitching vibrations in the direction of rotation around the straight line that connects the pair of motors 11a, 11b.

Further, when the plurality of detectors and the plurality of motors are placed, positions of them to be arranged are not limited to that of the embodiment above, as described below. Thus, the behaviors of the pitching vibrations in the directions of Yθ and Xθ can be detected and controlled.

Figure 3:
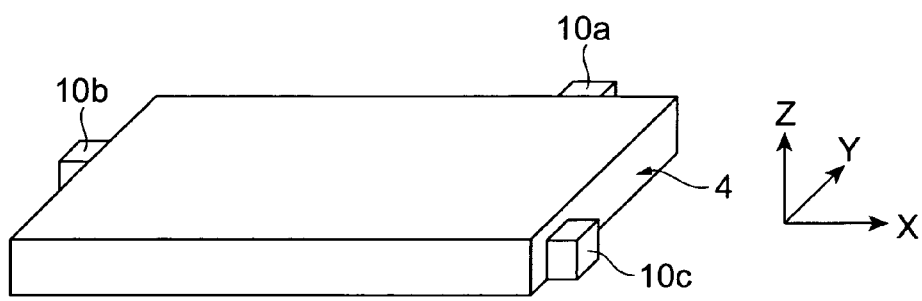
FIG. 3 is a view illustrating another example of the stage device in FIG. 1.
Figure 3:
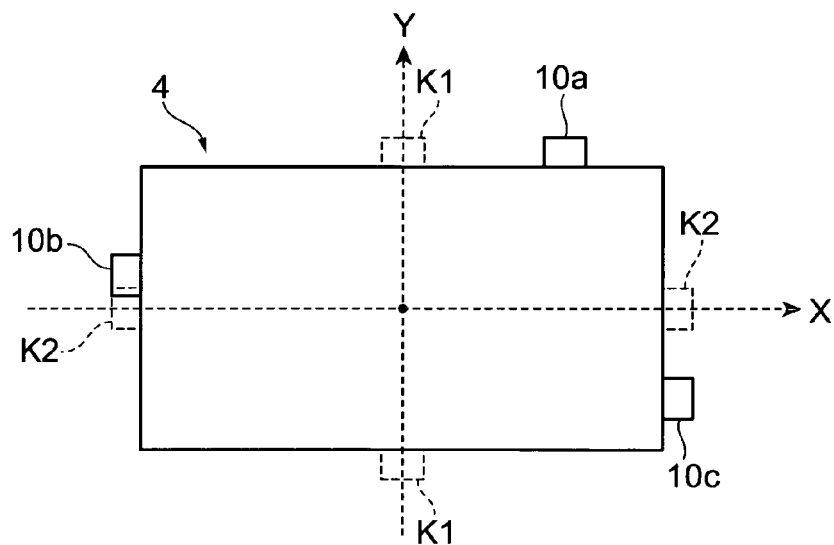
Figure 3:
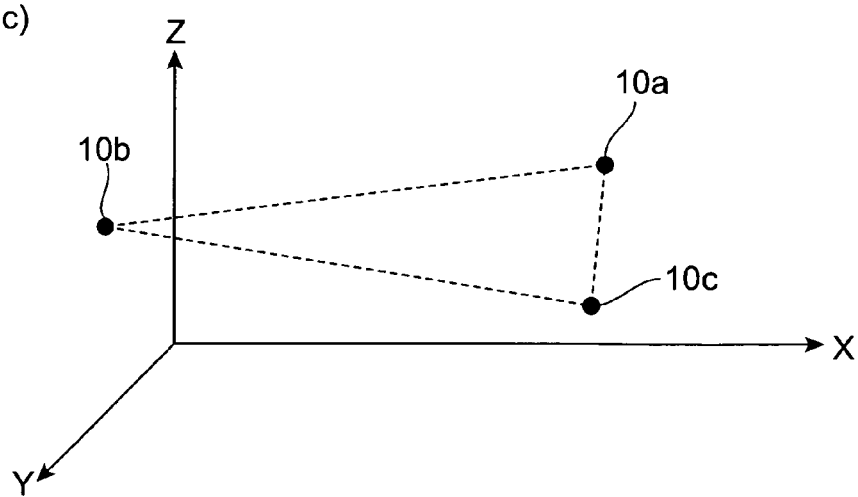

For example, as illustrated in FIGS. 3(a) and 3(b), even if the scales 10a, 10b, 10c are not arranged systematically, these positions can be grasped (refer to FIG. 3(c)) and then the following detection is possible. That is, as illustrated in FIG. 3(b), the detected value of each scale 10a, 10b, 10c is calculated as the detected values at reference positions K1, K1, based on the positional relationships grasped and the behavior of the pitching vibrations in the Xθ direction can be detected. Further, the detected value of each scale 10a, 10b, 10c is calculated as the detected values at the reference positions K2, K2, based on the positional relationships grasped and the behavior of the pitching vibrations in the Yθ direction can be detected.

Figure 4:
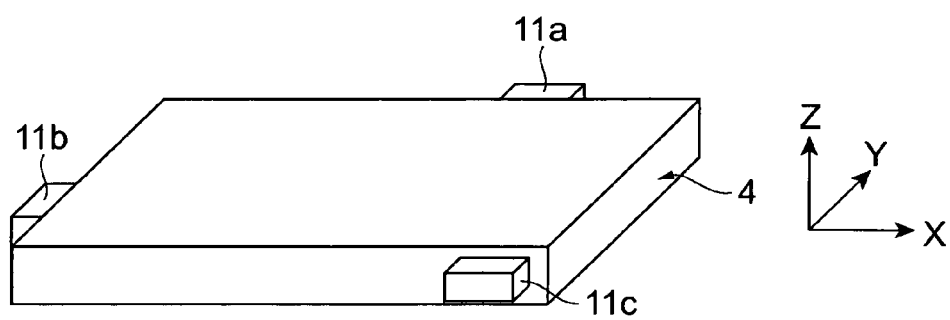
FIG. 4 is a view illustrating still another example of the stage device in FIG. 1.
Figure 4:
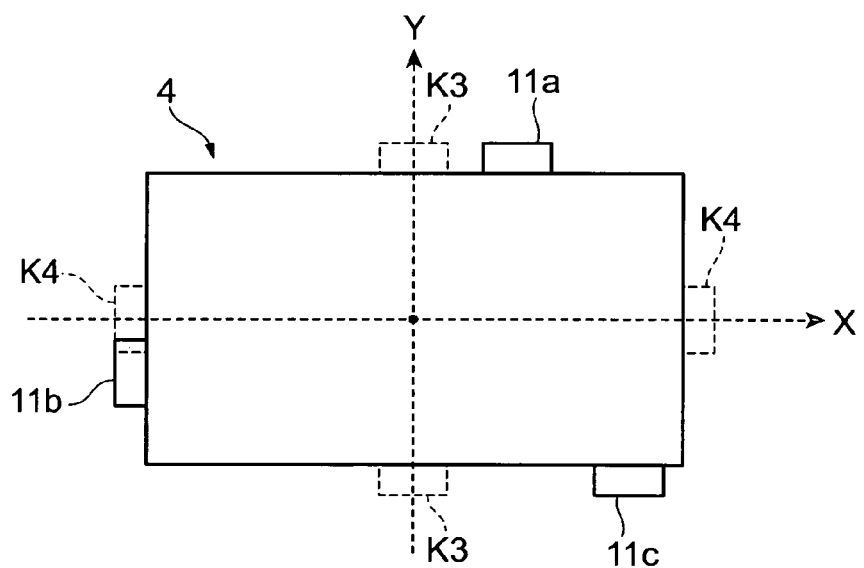
Figure 4:
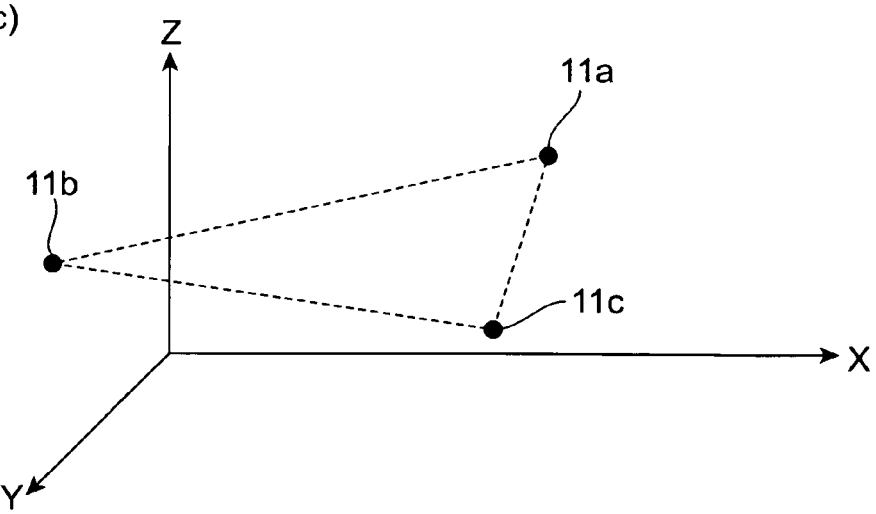

For example, as illustrated in FIGS. 4(a) and 4(b), in addition, even if the motors 11a, 11b, 11c are not arranged systematically, these positions can be grasped (refer to FIG. 4(c)) and then the following detection is possible. That is, as illustrated in FIG. 4(b), the drive of each motor 10a, 10b, 10c is considered as the drives at reference positions K3, K3, based on the positional relationships grasped and the pitching vibrations in the Xθ direction can be controlled. Further, the drive of each motor 10a, 10b, 10c is considered as the drives at reference positions K4, K4, based on the positional relationships grasped and the pitching vibrations in the Yθ direction can be detected.

According to the present invention, the vibrations of the second table supported on the first table which is movable in the one horizontal direction can be controlled.

What is claimed is:

1. A stage device having a first table movable in one horizontal direction and in a direction perpendicular to the one horizontal direction, and a second table supported by a support portion on the first table so as to enable rotation around a vertical axis and guided so as to enable movement in a vertical direction by a guide portion, comprising:
  a pair of detectors that are arranged apart from each other in the one horizontal direction on the second table and detect a position or a velocity in a vertical direction of the second table;
  a pair of motors that are arranged apart from each other in the one horizontal direction on the second table and drive the second table in the vertical direction of the second table; and
  a controller that controls the drives of the pair of motors based on detected values which are detected by each of the pair of detectors, wherein
  the second table is supported at a central portion thereof by the support portion, and
  the guide portion slidably couples with the second table by compressed air, and wherein
  the controller
  controls the pair of motors so as to be independent from each other, translationally moves the second table in the vertical direction based on an added value of the detected values detected by each of the pair of detectors, and controls an angular velocity in a pitching direction of the second table based on a subtracted value of the detected values detected by each of the pair of detectors, such that the angular velocity becomes zero to dampen pitching vibration, and further
  calculates a vertical-direction thrust command based on a difference between the added value of the detected values detected by each of the pair of detectors and a command value of the vertical direction position, and
  calculates a pitching-direction thrust command based on a difference between the subtracted value of the detected values detected by each of the pair of detectors and a command value of the angular velocity of the pitching direction,
  outputs a sum of the vertical-direction thrust command value and the pitching-direction thrust command value to one of the pair of motors, and
  outputs a difference between the vertical-direction thrust command value and the pitching-direction thrust command value to one of the pair of motors.

2. The stage device according to claim 1, wherein the pair of detectors and the pair of motors are placed in symmetric positions respectively relative to the one horizontal direction around a support point by the support portion in the second table.

3. The stage device according to claim 1, wherein the second table is movable in the vertical direction and the controller controls a position of the second table in the vertical direction.

4. The stage device according to claim 2, wherein the second table is movable in the vertical direction and the controller controls a position of the second table in the vertical direction.

5. A stage device having a first table movable in one horizontal direction and in a direction perpendicular to the one horizontal direction and a second table supported by a support portion on the first table so as to enable rotation around a vertical axis and guided so as to enable movement in a vertical direction by a guide portion, comprising:
  a plurality of detectors that are arranged apart from each other in the one horizontal direction on the second table and detect a position or a velocity in a vertical direction of the second table;
  a plurality of motors that are arranged apart from each other in the one horizontal direction on the second table and drive the second table in the vertical direction of the second table; and
  a controller that controls the drives of the plurality of motors based on detected values which are detected by each of the plurality of detectors, wherein
  the second table is supported at a central portion thereof by the support portion, and
  the guide portion slidably couples with the second table by compressed air, and wherein
  the controller
  controls the plurality of motors so as to be independent from each other, translationally moves the second table in the vertical direction based on an added value of the detected values detected by each of the plurality of detectors, and controls an angular velocity in a pitching direction of the second table based on a subtracted value of the detected values detected by each of the plurality of detectors, such that the angular velocity becomes zero to dampen pitching vibration, and further
  calculates a vertical-direction thrust command based on a difference between the added value of the detected values detected by each of the plurality of detectors and a command value of the vertical direction position, and
  calculates a pitching-direction thrust command based on a difference between the subtracted value of the detected values detected by each of the plurality of detectors and a command value of the angular velocity of the pitching direction,
  outputs a sum of the vertical-direction thrust command value and the pitching-direction thrust command value to one of the plurality of motors, and
  outputs a difference between the vertical-direction thrust command value and the pitching-direction thrust command value to one of the plurality of motors.

* * * * *